(12) United States Patent
Thiagarajan et al.

(10) Patent No.: US 7,864,825 B2
(45) Date of Patent: Jan. 4, 2011

(54) METHOD AND SYSTEM FOR A LASER DIODE BAR ARRAY ASSEMBLY

(75) Inventors: Prabhu Thiagarajan, Tucson, AZ (US); Mark McElhinney, Tucson, AZ (US); Jason Helmrich, Tucson, AZ (US); Feliks Lapinski, Tucson, AZ (US)

(73) Assignee: Lasertel, Inc., Tucson, AZ (US)

( * ) Notice: Subject to any disclaimer, the term of this patent is extended or adjusted under 35 U.S.C. 154(b) by 0 days.

(21) Appl. No.: 11/829,030

(22) Filed: Jul. 26, 2007

(65) Prior Publication Data

US 2008/0037602 A1 Feb. 14, 2008

Related U.S. Application Data

(60) Provisional application No. 60/822,071, filed on Aug. 10, 2006.

(51) Int. Cl.
*H01S 3/04* (2006.01)

(52) U.S. Cl. .................. 372/36; 372/34; 257/E33.075; 257/701; 257/706; 438/34

(58) Field of Classification Search .................. 372/36, 372/34; 257/E33.075; 438/34
See application file for complete search history.

(56) References Cited

U.S. PATENT DOCUMENTS

| | | | | |
|---|---|---|---|---|
| 4,092,614 A | 5/1978 | Sakuma et al. | ........... | 331/94.5 P |
| 4,881,237 A | 11/1989 | Donnelly | ..................... | 372/50 |
| 4,903,274 A | 2/1990 | Taneya et al. | ................. | 372/48 |
| 4,947,401 A | 8/1990 | Hinata et al. | ................... | 372/50 |
| 4,980,893 A | 12/1990 | Thornton et al. | ............... | 372/50 |
| 5,031,187 A | 7/1991 | Orenstein et al. | .............. | 372/50 |
| 5,040,187 A | 8/1991 | Karpinski | ..................... | 372/50 |
| 5,060,237 A | 10/1991 | Peterson | ....................... | 372/50 |
| 5,061,974 A | 10/1991 | Onodera et al. | ................ | 357/17 |
| 5,105,430 A | 4/1992 | Mundinger et al. | ........... | 372/35 |
| 5,128,951 A | 7/1992 | Karpinski | ..................... | 372/50 |
| 5,212,707 A | 5/1993 | Heidel et al. | ................... | 372/50 |
| 5,284,790 A | 2/1994 | Karpinski | .................... | 437/129 |
| 5,305,344 A | 4/1994 | Patel | ............................ | 372/50 |
| 5,311,535 A | 5/1994 | Karpinski | ..................... | 372/50 |
| 5,325,384 A * | 6/1994 | Herb et al. | ..................... | 372/36 |
| 5,394,426 A | 2/1995 | Joslin | ........................... | 372/50 |
| 5,418,799 A | 5/1995 | Tada | ............................ | 372/44 |
| 5,440,577 A | 8/1995 | Tucker | ......................... | 372/50 |
| 5,497,391 A | 3/1996 | Paoli | ............................ | 372/50 |
| 5,568,498 A | 10/1996 | Nilsson | ........................ | 372/43 |
| 5,627,850 A | 5/1997 | Irwin et al. | .................... | 372/43 |
| 5,644,586 A | 7/1997 | Kawano et al. | ................ | 372/44 |
| 5,764,675 A | 6/1998 | Juhala | .......................... | 372/50 |
| 5,848,083 A * | 12/1998 | Haden et al. | ................... | 372/36 |
| 5,913,108 A | 6/1999 | Stephens et al. | ............ | 438/109 |

(Continued)

OTHER PUBLICATIONS

Official Action issued in Applicants' corresponding EPO Application Serial No. 07 117 048.7-2222.

*Primary Examiner*—Tod T Van Roy
*Assistant Examiner*—Delma R Forde
(74) *Attorney, Agent, or Firm*—Hayes Soloway P.C.

(57) ABSTRACT

A laser diode array is formed on a heat sink having an insulating layer in which a plurality of grooves is formed through the ceramic layer and to or into the heat sink. A laser diode stack is soldered to the ceramic layer.

17 Claims, 3 Drawing Sheets

U.S. PATENT DOCUMENTS

| | | | |
|---|---|---|---|
| 5,923,692 A * | 7/1999 | Staskus et al. | 372/50.12 |
| 6,295,307 B1 * | 9/2001 | Hoden et al. | 372/36 |
| 6,352,873 B1 | 3/2002 | Hoden | 438/28 |
| 6,424,667 B1 | 7/2002 | Endriz et al. | 372/36 |
| 7,286,359 B2 * | 10/2007 | Khbeis et al. | 361/704 |
| 2002/0001864 A1 * | 1/2002 | Ishikawa et al. | 438/22 |
| 2002/0009106 A1 * | 1/2002 | Miyokawa et al. | 372/36 |
| 2004/0052280 A1 * | 3/2004 | Rice | 372/36 |
| 2004/0082112 A1 | 4/2004 | Stephens | 438/122 |
| 2004/0264521 A1 * | 12/2004 | Ness et al. | 372/38.1 |
| 2005/0095755 A1 * | 5/2005 | Nakata et al. | 438/151 |

* cited by examiner

METHOD AND SYSTEM FOR A LASER DIODE BAR ARRAY ASSEMBLY

CROSS REFERENCE TO RELATED APPLICATION

This application claims priority from U.S. Provisional Application Ser. No. 60/822,071, filed Aug. 10, 2006 the contents of which are incorporated herein by reference.

FIELD OF THE INVENTION

The present invention is generally related to laser diodes, and more particularly is related to a laser diode bar array assembly and method for manufacturing a laser diode bar assembly.

BACKGROUND OF THE INVENTION

1. Field of the Invention

The present invention relates to laser diodes, and more particularly to a laser diode assembly which promotes accurate spacing and alignment of diode bars, cooling of diode bars and electrical conductivity through the diode bars, and facilitates assembly.

2. Background Art

Laser diode arrays are in general used in a wide variety of industrial and research applications. Pluralities of diode bars are mounted on a substrate to provide the multiplied power of numerous bars, versus the effect offered by a single bar. For arrays that are operated in harsh environments such as high temperatures or rapidly changing temperatures it is desired that the entire array assembly be assembled with high temperature solders. In arrays that are fabricated with high temperature solders it is imperative to minimize the stress induced in the laser bar from the assembly process. To optimize the efficiency of a multiple diode bar array the materials used must also have high electrical conductivity and thermal conductivity. This requires the use of different materials that have different thermal expansion properties. In a hard soldered assembly small thermal expansion mismatches can cause stress on the bars and hence reliability issues. In addition good alignment of the bars is necessary to maintain high efficiency, good performance, and high reliability.

Most efforts in the art have focused upon modes and means of mounting numerous diode bars quickly and inexpensively. The mounting of numerous bars into a single array historically has been a somewhat labor and/or cost intensive proposition, thus partially impeding the development of economical products and devices incorporating laser diode arrays.

For example, U.S. Pat. Nos. 5,040,187 and 5,284,790, both to Karpinski, show a "monolithic" laser diode array. These patents teach a substrate having a number of grooves formed therein, and into which the diode bars are inserted. The substrate is flexed into an arc to widen the grooves; the diode bars are inserted into the temporarily widened grooves, after which the substrate is relaxed and allowed elastically to return to its normal shape, which results in an effective narrowing of the grooves thereby to help hold the inserted diodes in place. A variety of "submounts" for the array also are taught. However, the methods and configurations of the disclosures are not conducive to diode bar alignment, as the bars tend to tip and roll within the grooves during assembly.

U.S. Pat. No. 5,128,951 to Karpinski also shows a particular type of laser diode array and method of fabrication. The disclosure has to do with providing an inexpensive mode of manufacturing a diode bar array. A substrate is provided with two layers, an upper conductive layer immediately above and in flush contact with a lower non-conductive layer. The grooves for receiving the diode bars are cut into the substrate so as to completely pierce the upper layer and penetrate into the lower non-conductive layer. The disclosure purports thereby to provide a means for mounting diode bars which promotes conductivity between bars while also providing heat transfer into the lower electrically insulating layer. The maximized alignment of the bars in the grooves also is not taught.

U.S. Pat. No. 5,305,344 to Patel discloses a laser diode array. This disclosure teaches diversity in diode bar packing, and a configuration which possibly eases the replacement of defective individual bars, but is comparatively complex and expensive.

U.S. Pat. No. 5,311,535 to Karpinski shows a laser diode array which provides for laser emission from the minor surfaces of the diode bars. The device involves the disposition of diode bars into a grooved substrate. Diode bar alignment is not carefully optimized.

Other United States patents of interest in the field include U.S. Pat. No. 6,295,307 to Hoden; U.S. Pat. No. 5,644,586 to Kawano et al.; U.S. Pat. No. 5,627,850 to Irwin et al.; U.S. Pat. No. 5,568,498 to Nilsson; U.S. Pat. No. 5,497,391 to Paoli; U.S. Pat. No. 5,418,799 to Tada; U.S. Pat. No. 5,440,577 to Tucker; U.S. Pat. No. 5,394,426 to Joslin; U.S. Pat. No. 5,212,707 to Heidel et al.; U.S. Pat. No. 5,105,430 to Mundinger et al.; U.S. Pat. No. 5,031,187 to Orenstein et al.; U.S. Pat. No. 5,061,974 to Onodera et al; U.S. Pat. No. 5,060,237 to Peterson; U.S. Pat. No. 4,980,893 to Thornton et al.; U.S. Pat. No. 4,947,401 to Hinata et al.; U.S. Pat. No. 4,903,274 to Taneya et al.; U.S. Pat. No. 4,881,237 to Donnelly; and U.S. Pat. No. 4,092,614 to Sakuma et al.

Nevertheless, a need remains for a means and method of providing a laser diode array which at once is simple and economical that can operate in harsh environments, and yet provide reliable operation, optimized diode bar alignment to promote emission efficiency without sacrificing efficient electrical conductivity between, and cooling of, the diode bars.

Thus, a heretofore unaddressed need exists in the industry to address the aforementioned deficiencies and inadequacies.

The foregoing discussion of the prior art derives primarily from U.S. Pat. No. 6,352,873 to Hoden who discloses a method for assembling a diode bar assembly by locating a first conductive spacer on a planer working surface; disposing a first solder preform on the first conductive spacer; placing a diode bar on the first solder preform; disposing a second solder preform on the diode bar; placing a second conductor spacer on the second solder preform; compressing the spacers, preforms and diode bar parallel together; heating the solder preforms above their melting temperatures, and allowing the melted solder preforms to harden by cooling.

SUMMARY OF THE INVENTION

The present invention provides an improved laser diode assembly and assembly method which overcomes aforesaid and other disadvantages of the prior art. More particularly, the present invention provides a laser diode bar assembly in which a metallized insulating layer is soldered to a heat sink. A plurality of parallel grooves are cut through the insulating layer to or into the heat sink leaving the insulating layer in the form of a mesh with plurality of parallel streets formed on the heat sink. A laser diode stack consisting of a plurality of laser diode bars and spacers preferably, but not necessarily, formed of the same material as the heat sink is then soldered to the grooved insulating layer with the laser diode bars located over the grooves with the spacers affixed to the streets. With this arrangement, the individual streets are free to move with the expansion of the heat sink. This minimizes the stress induced on the laser bars due to any mismatch of the thermal expansion coefficients between the heatsink, insulating layer, and the laser diode bar. The reduced effects of stress due to mismatches in coefficient of thermal expansion maintains the integrity of the laser diode bar and allows the use of high temperature solders. The insulating layer streets provide both thermal conduction as well as electrical isolation between the laser diode bars.

BRIEF DESCRIPTION OF THE DRAWINGS

Further features and advantages of the present invention can be better understood with reference to the following drawings, wherein like reference numerals designate like parts, and wherein.

DETAILED DESCRIPTION

Figure 1:
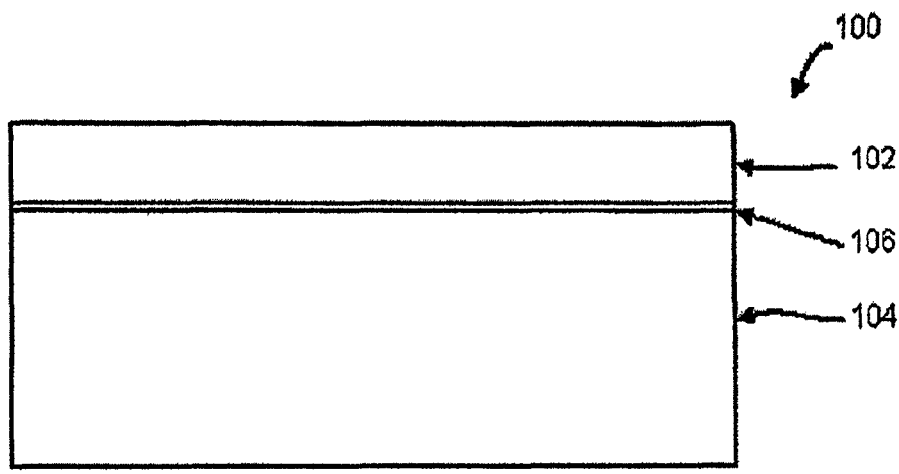
FIGS. 1-3 are side elevational views of a laser diode bar array at various stages of assembly in accordance with a preferred embodiment of the invention.

FIGS. 1-4 illustrate a first exemplary embodiment of the laser diode bar array 100 in various stages of assembly in accordance with the present invention. FIG. 1 is a side elevational view of the laser diode bar array 100 in an early stage of assembly, in accordance with the first exemplary embodiment of the invention. An electrical insulating layer 102 is mounted with solder 106 to a heat sink 104 formed of a conventionally used materials or alloys such as, copper, tungsten, a copper tungsten alloy, diamond, a composites containing diamond, graphite or berrillium oxide. The insulating layer 102 may be formed of a ceramic such as aluminum nitride or any other thermally conductive, electrically insulating material generally used for such purpose, (e.g., berrillium oxide, silicon, insulating composites containing diamonds) and is metallized on both faces. The solder 106 may be a hard, high-temperature solder, such as an AuGe or AuSn solder. However, other solders formed of, indium, lead, tin, gold or silver may also be used.

Figure 2:
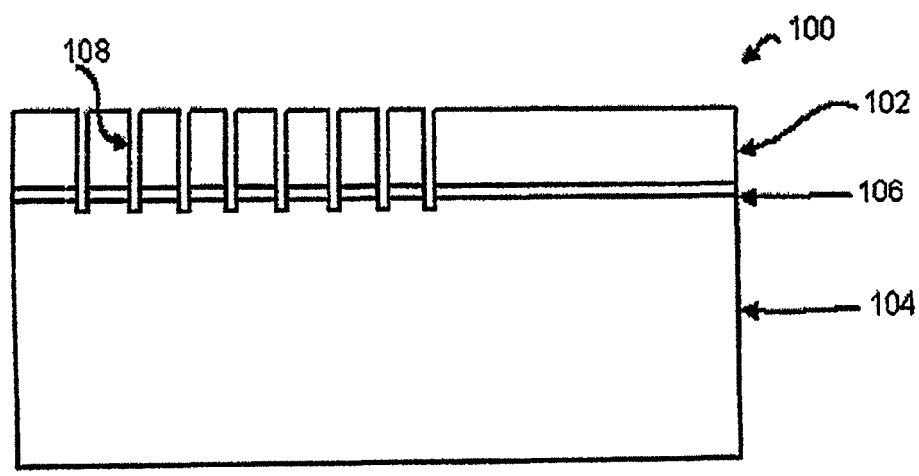

FIG. 2 is a side elevational view of a laser diode bar array 100 in a medial stage of assembly, in accordance with a first exemplary embodiment of the invention. FIG. 2 shows the insulating layer 102 is mounted to the heat sink 104 with solder 106. A plurality of grooves 108 are formed through the insulating layer 102 and the solder 106 to or partially into the heat sink 104. The grooves 108 are machined parallel to one another in a mesh pattern, e.g., using a dicer or the like, leaving a plurality of parallel streets 109.

Figure 3:
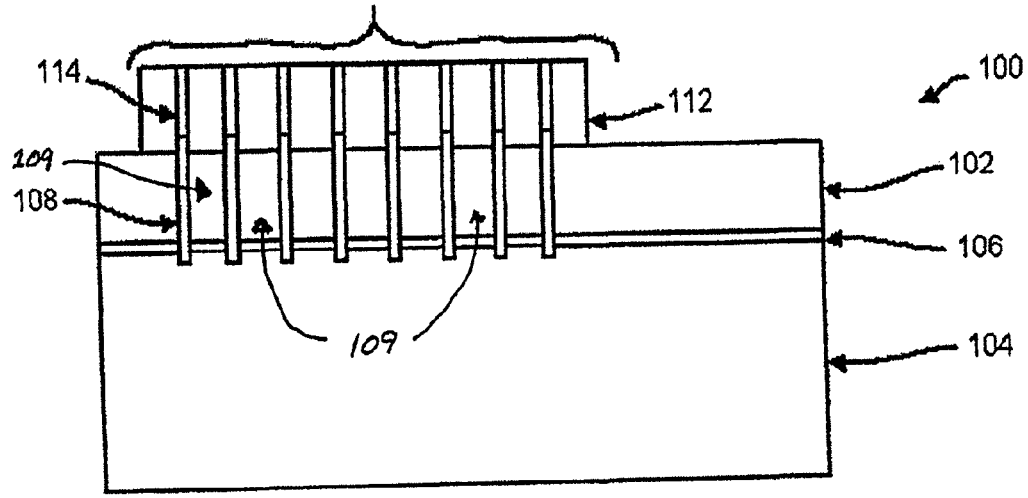
Figure 4:
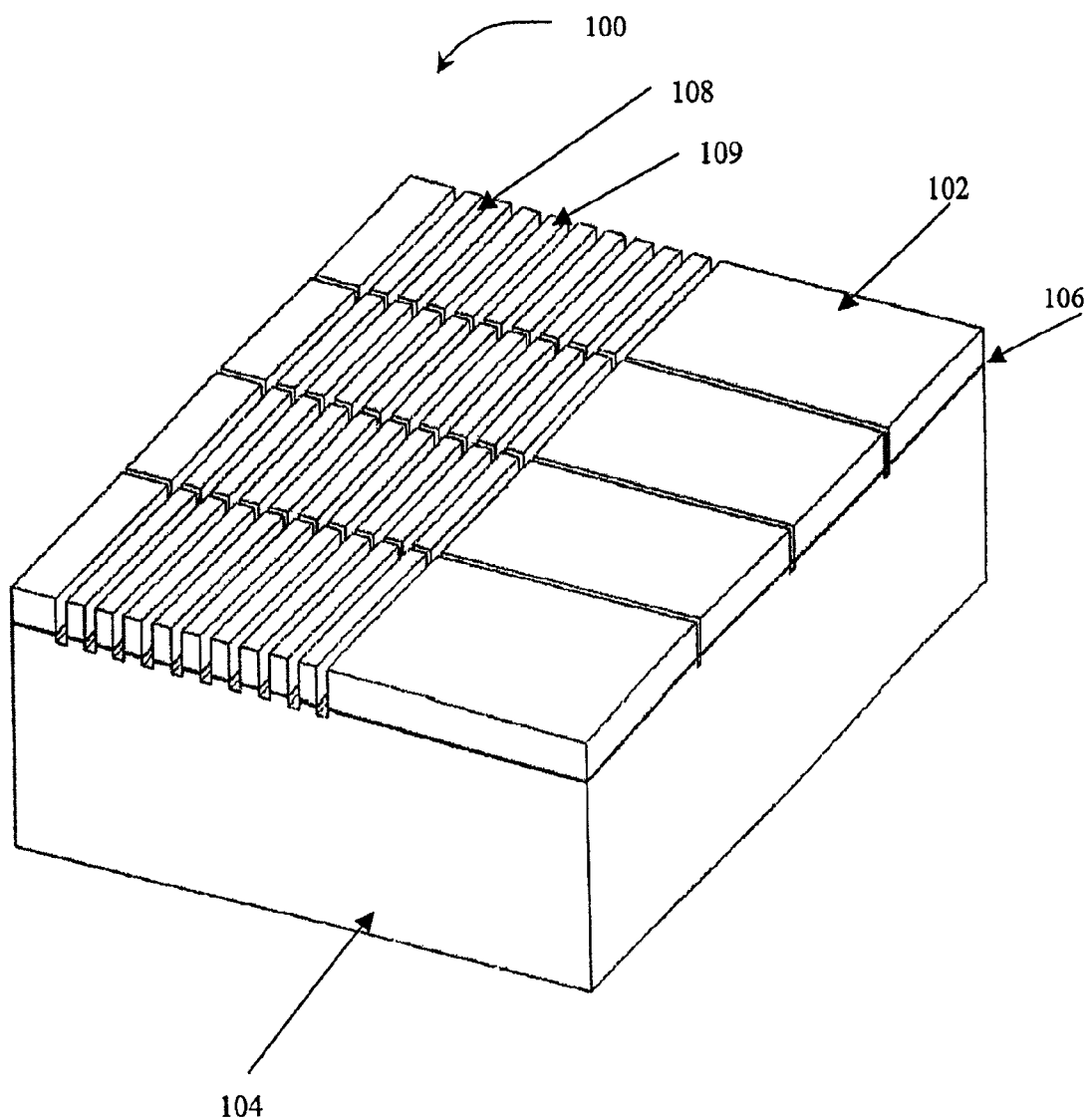
FIG. 4 is a perspective view of a laser diode bar array in accordance with a preferred embodiment of the invention.

FIG. 3 is a side elevational view of a laser diode bar array 100, in accordance with the first exemplary embodiment of the invention. A laser diode stack 110 formed by alternating spacers 112 and laser diode bars 114 is soldered to the top surface of the insulating layer 102 using a hard, high temperature solder which can be, but not necessarily, of same composition as the hard solder used to mount the insulating layer 102 to the heat sink 104. The spacers 112 preferably are formed of the same material similar as that used to form the heat sink 104, such as copper, tungsten, a copper tungsten alloy, diamond, composites containing diamond, graphite or berrillium oxide. As can be seen in FIG. 3, the laser diode bars 114 are centered over the grooves 108 while the spacers 112 are centered over and mounted to the streets 109. With this arrangement the individual streets are free to move with expansion and contraction of the heat sink, whereby the effects of stress due to mismatch in the coefficient of thermal expansion of the laser diode bar stack, the insulating layer, and the heat sink assembly may be minimized.

Minimizing the stress effect due to mismatch in the coefficients of thermal expansions also allows the use of hard solder between the laser diode stack 110 and the streets 109. The streets 109 thus provide both thermal conduction as well as electrical isolation between the individual laser diode bars 114. See also FIG. 4.

Figure 5:
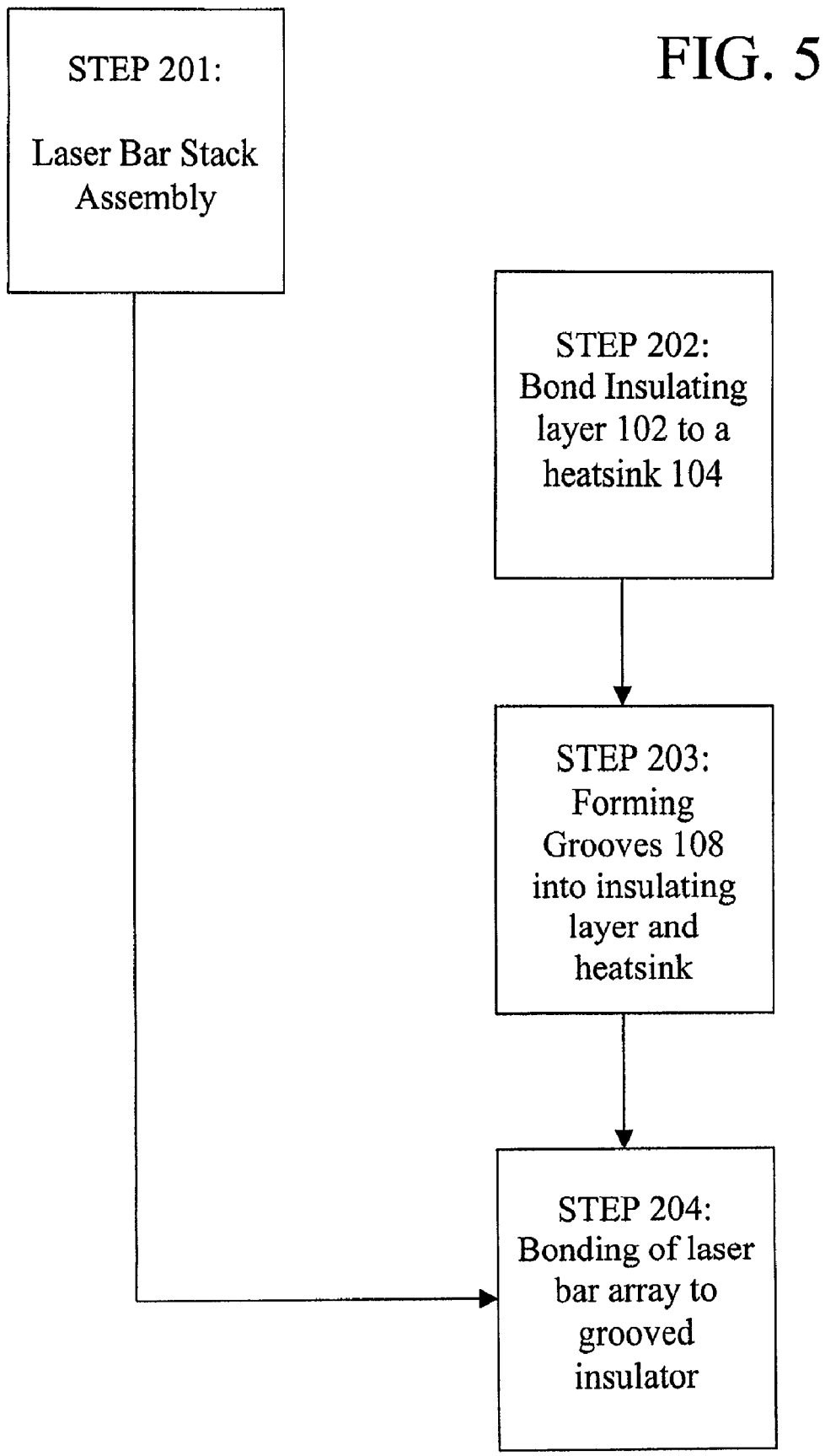
FIG. 5 is a flowchart illustrating a method of providing a laser diode bar array assembly, in accordance with a preferred embodiment of the invention.

FIG. 5 is a flowchart illustrating a method of providing laser diode bar array assembly 100, in accordance with the first exemplary embodiment of the invention. It should be noted that any process descriptions or blocks in flow charts should be understood as representing modules, segments, portions of code, or steps that include one or more instructions for implementing specific logical functions in the process, and alternate implementations are included within the scope of the present invention in which functions may be executed out of order from that shown or discussed, including substantially concurrently or in reverse order, depending on the functionality involved.

As is shown by step 202, a metallized insulating layer 102 is joined to a heat sink 104 by a solder 106. A plurality of grooves 108 is formed through the metallized insulating layer 102 and solder 106 to or partially into the heat sink 104 (step 203). A laser diode stack 110 is formed of a plurality of spacers 112 and a plurality of laser diode bars 114 in alternating fashion (step 201), is then soldered onto the top of streets 109 of the metallized insulating layer 102 (step 204).

It is thus seen that the present invention provides a simple and low cost solution to minimizing the effects of stress induced due to mismatches in the coefficient of thermal expansion of components used in a diode bar array assembly.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

What is claimed is:

1. A laser diode array comprising
a heat sink;
a metallized insulating layer mounted on the heat sink, said metallized insulating layer having a plurality of slots or grooves formed through the insulating layer to or into the heat sink; and
a laser diode bar array comprising a plurality of laser diode bars separated by electrically conducting spacers mounted to the insulating layer with the laser diode bars located over the slots or grooves.

2. A laser diode array as claimed in claim 1, wherein the heat sink and the spacers are formed of the same material.

3. A laser diode array as claimed in claim 1, wherein the heat sink and the spacers are formed from different materials that are closely matched for thermal expansion.

4. The laser diode array as claimed in claim 1, wherein the insulating layer is mounted to the heat sink by solder.

5. The laser diode array as claimed in claim 1, wherein the laser diode bar array is mounted to the insulating layer by solder.

6. The laser diode array as claimed in claim 1, wherein the slots or grooves through the insulating layer are formed in place after the insulating layer is mounted to the heat sink.

7. The laser diode array as claimed in claim 1, wherein the heat sink is formed of a material selected from the group consisting of copper, tungsten, a copper/tungsten alloy, diamond, composites containing diamond, graphite and beryllium oxide.

8. The laser diode assembly as claimed in claim 4, wherein the insulating material comprises a ceramic, and the solder comprises a high temperature solder.

9. The laser diode assembly as claimed in claim 4, wherein the insulating material comprises a composite material containing diamond, and the solder comprises a high temperature solder.

10. The laser diode assembly as claimed in claim 8, wherein the high temperature solder comprises an AuGe solder or an AuSn solder.

11. The laser diode assembly as claimed in claim 5, wherein the solder comprises a high temperature solder.

12. The laser diode assembly as claimed in claim 11, wherein the solder comprises an AuGe solder or an AuSn solder.

13. A method of forming a laser diode array as claimed in claim 1, comprising:

provrding a heat sink bonded to an insulating layer;

forming slots or grooves through the insulating layer to or into the heat sink; and bonding laser diode bars aligned over the grooves.

14. The method as claimed in claim 13, wherein the slots or grooves are formed parallel to one another.

15. The method as claimed in claim 13, wherein the laser diode bars are bonded over the slots or grooves by soldering.

16. The method as claimed in claim 15, wherein a hard solder is used in the soldering.

17. The method as claimed in claim 16, wherein the hard solder comprises an AuGe solder or an AuSn solder.

\* \* \* \* \*